US011500286B2

(12) United States Patent
Kanna et al.

(10) Patent No.: US 11,500,286 B2
(45) Date of Patent: Nov. 15, 2022

(54) PHOTOSENSITIVE RESIN COMPOSITION, TRANSFER FILM, DECORATIVE PATTERN, AND TOUCH PANEL

(71) Applicant: FUJIFILM Corporation, Tokyo (JP)

(72) Inventors: Shinichi Kanna, Shizuoka (JP); Kazumasa Morozumi, Shizuoka (JP); Takashi Aridomi, Shizuoka (JP); Soji Ishizaka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1030 days.

(21) Appl. No.: 16/197,542

(22) Filed: Nov. 21, 2018

(65) Prior Publication Data

US 2019/0086802 A1 Mar. 21, 2019

Related U.S. Application Data

(63) Continuation of application No. PCT/JP2017/018740, filed on May 18, 2017.

(30) Foreign Application Priority Data

May 31, 2016 (JP) ............................ JP2016-109184

(51) Int. Cl.
*G03F 7/033* (2006.01)
*C08F 2/44* (2006.01)
(Continued)

(52) U.S. Cl.
CPC ................ *G03F 7/033* (2013.01); *C08F 2/44* (2013.01); *C08F 2/48* (2013.01); *G03F 7/0047* (2013.01); *G03F 7/105* (2013.01); *G06F 3/0446* (2019.05)

(58) Field of Classification Search
CPC ...................................................... G03F 7/105
See application file for complete search history.

(56) References Cited

U.S. PATENT DOCUMENTS 5,516,606 A * 5/1996 Sato ...................... G03F 7/2022 430/7
6,010,824 A * 1/2000 Komano ............... G03F 7/0295 430/920
(Continued)

FOREIGN PATENT DOCUMENTS

CN 103969948 A 8/2014
CN 104076605 A 10/2014
(Continued)

OTHER PUBLICATIONS

Machine transition of JP 2015127730 (no date).*
(Continued)

*Primary Examiner* — Amanda C. Walke
(74) *Attorney, Agent, or Firm* — Sughrue Mion, PLLC

(57) ABSTRACT

Provided are a photosensitive resin composition including: a binder; a polymerizable monomer; a polymerization initiator; a pigment; and a solvent, in which the polymerizable monomer includes a difunctional polymerizable monomer having a molecular weight equal to or smaller than 500, and a content of the difunctional polymerizable monomer having a molecular weight equal to or smaller than 500 is equal to or greater than 50% by mass with respect to a total mass of the polymerizable monomer, a transfer film, a decorative pattern, and a touch panel.

9 Claims, 2 Drawing Sheets

16
14
10
12

(51) Int. Cl.

| | |
|---|---|
| ***C08F 2/48*** | (2006.01) |
| ***G03F 7/105*** | (2006.01) |
| ***G06F 3/044*** | (2006.01) |
| ***G03F 7/004*** | (2006.01) |

(56) References Cited

U.S. PATENT DOCUMENTS

| | | | | |
|---|---|---|---|---|
| 6,132,937 | A * | 10/2000 | Suzuki | G03F 7/0047 430/908 |
| 6,140,019 | A * | 10/2000 | Sakurai | G03F 7/0007 430/196 |
| 2013/0072615 | A1 | 3/2013 | Muro et al. | |
| 2014/0290990 | A1 | 10/2014 | Shimura et al. | |
| 2014/0363767 | A1* | 12/2014 | Murakami | G03F 7/0045 430/311 |
| 2015/0015813 | A1 | 1/2015 | Yoshinari et al. | |
| 2016/0161847 | A1 | 6/2016 | Araki et al. | |

FOREIGN PATENT DOCUMENTS

| | | | |
|---|---|---|---|
| CN | 104246611 | A | 12/2014 |
| CN | 104380199 | A | 2/2015 |
| CN | 105378615 | A | 3/2016 |
| JP | 2008-256729 | A | 10/2008 |
| JP | 2012-078528 | A | 4/2012 |
| JP | 2012-122045 | A | 6/2012 |
| JP | 2012-255925 | A | 12/2012 |
| JP | 2013-228695 | A | 11/2013 |
| JP | 2014-145821 | A | 8/2014 |
| JP | 2015-127730 | A | 7/2015 |
| JP | 2015127730 | A * | 7/2015 |
| WO | 2013/187209 | A1 | 12/2013 |
| WO | 2015/012228 | A1 | 1/2015 |

OTHER PUBLICATIONS

Office Action dated May 26, 2020 in Japanese Application No. 2018-520795.

Communication dated Aug. 27, 2019, from the Japanese Patent Office in counterpart Application No. 2018-520795.

Communication dated Mar. 8, 2021, issued by The State Intellectual Property Office of The P.R. Of China in Application No. 201780030673.3.

International Search Report of PCT/JP2017/018740 dated Aug. 8, 2017.

Written Opinion of PCT/JP2017/018740 dated Aug. 8, 2017.

International Preliminary Search Report on Patentability with the translation of Written Opinion dated Dec. 4, 2018 issue by the International Bureau in PCT/JP2017/018740.

Office Action dated Oct. 9, 2021 in Chinese Application No. 201780030673.3.

* cited by examiner

PHOTOSENSITIVE RESIN COMPOSITION, TRANSFER FILM, DECORATIVE PATTERN, AND TOUCH PANEL

CROSS-REFERENCE TO RELATED APPLICATIONS

This application is a continuation application of International Application No. PCT/JP2017/018740, filed May 18, 2017, the disclosure of which is incorporated herein by reference in its entirety. Further, this application claims priority from Japanese Patent Application No. 2016-109184, filed May 31, 2016, the disclosure of which is incorporated herein by reference in its entirety.

BACKGROUND OF THE INVENTION

1. Field of the Invention

The present disclosure relates to a photosensitive resin composition, a transfer film, a decorative pattern, and a touch panel.

2. Description of the Related Art

As the photosensitive resin composition, the following components are known.

For example, JP2013-228695A discloses a black resin film including a black pigment, an alkali-soluble polymer compound, an ethylenically unsaturated hexafunctional bond-containing compound, and a photopolymerization initiator, and in which bulk strength, after heating at 240° C. for 80 minutes and heating at 300° C. for 30 minutes, is equal to or greater than 100 N/1.6 mmϕ (ϕ is a diameter).

JP2013-228695A discloses a method of manufacturing a black resin film including a step of applying a photosensitive resin composition including a black pigment, an alkali-soluble polymer compound, an ethylenically unsaturated hexafunctional bond-containing compound, and a photopolymerization initiator, onto a base material, a step of exposing the photosensitive resin composition on the base material, a step of developing the exposed photosensitive resin composition, and a step of performing post exposure after the development step, as a method of manufacturing the black resin film.

In addition, a photosensitive composition including a photopolymerization initiator, and at least one kind selected from a resin or a precursor thereof has been proposed (for example, see JP2008-256729A).

Further, a photosensitive composition including a resin including an acidic group on a side chain, a tetra- to hexafunctional polymerizable compound and a hexa- to octafunctional polymerizable compound, and a photopolymerization initiator has been proposed (for example, JP2012-078528A).

SUMMARY OF THE INVENTION

In various displays such as image display devices such as a cathode-ray tube display device, a plasma display, an electroluminescent display, fluorescence display, a field emission display, and a liquid crystal display (LCD), and a smart phone or a tablet terminal mounted with a touch panel, a decorative material including a decorative layer on a substrate is provided on a surface of a display, in order to realize various designs, for example, concealing wirings disposed on a main body. For example, a decorative material provided with a decorative layer which is a black resin cured layer including a black pigment on a periphery has been broadly used on a surface of an image display device, in order to conceal the wirings.

The decorative layer used for such a touch panel may be formed using a transfer film including a photosensitive resin layer. In a case of forming the decorative layer using this transfer film, a step of transferring a photosensitive resin layer of a transfer film to a base material, a step of exposing the photosensitive resin layer with a desired pattern, a step of developing the photosensitive resin layer, and a step of performing heat treatment (hereinafter, also referred to as baking) of the photosensitive resin layer to form a tapered shape are performed, for example.

A colored resin composition for a color filter disclosed in JP2013-228695A is used for forming a black resin cured layer for color resist, and the heat treatment at a high temperature (approximately 240° C.) can be performed in the step of performing the heat treatment to form a tapered shape.

Meanwhile, a resin base material, for example, may be used for the base material, for the usage of a touch panel, and in a case of forming the decorative layer on the resin base material, it is necessary to perform the heat treatment at a low temperature of approximately 140° C., in the step of performing the heat treatment to form a tapered shape. In this case, since the ethylenically unsaturated hexafunctional bond-containing compound is only used in the colored resin composition for a color filter disclosed in JP2013-228695A, crosslink density of a cured material after the curing is high, and a tapered shape may not be formed in the heat treatment at a low temperature, thus, the cured material may not be used.

In addition, regarding the photosensitive resin composition, it is necessary to use a weak alkali developer such as a sodium carbonate aqueous solution, from a viewpoint of productivity.

As in a case of the photosensitive compositions disclosed in JP2008-256729A and JP2012-078528A, the photosensitive resin composition including a large amount of a polymerizable compound having three or more functional groups easily causes occurrence of development residue in development using the weak alkali developer, and thus, the photosensitive resin composition may not be used in the development using the weak alkali developer.

Since a desired pattern is formed on the photosensitive resin layer by exposure and development, it is necessary that the photosensitive resin composition includes a polymerization initiator.

However, in a case where a content of the polymerization initiator in the photosensitive resin composition is excessively great, a frequency of the occurrence of development residue tends to increase, in a case of developing the photosensitive resin composition.

The invention is made in view of such circumstances, and one embodiment of the invention provides a photosensitive resin composition and a transfer film, in which occurrence of development residue in development using a weak alkali developer (for example, a sodium carbonate aqueous solution) is prevented and a tapered shape can be formed in heat treatment at a low temperature.

Another embodiment of the invention provides a decorative pattern or a touch panel manufactured using the photosensitive resin composition and the transfer film.

The invention includes the following embodiments.

<1> A photosensitive resin composition comprising: a binder; a polymerizable monomer; a polymerization initiator; a pigment; and a solvent, in which the polymerizable monomer includes a difunctional polymerizable monomer having a molecular weight equal to or smaller than 500, and a content of the difunctional polymerizable monomer having a molecular weight equal to or smaller than 500 is equal to or greater than 50% by mass with respect to a total mass of the polymerizable monomer.

<2> The photosensitive resin composition according to <1>, in which the pigment is a black pigment.

<3> The photosensitive resin composition according to <2>, in which the black pigment is carbon black.

<4> The photosensitive resin composition according to any one of <1> to <3>, in which a ratio of a content mass of the polymerizable monomer with respect to a content mass of the binder is 0.10 to 0.50.

<5> The photosensitive resin composition according to any one of <1> to <4>, in which a ratio of a content mass of the polymerizable monomer with respect to a content mass of the binder is 0.32 to 0.36.

<6> The photosensitive resin composition according to any one of <1> to <5>, in which a weight-average molecular weight of the binder is 5,000 to 15,000.

<7> The photosensitive resin composition according to any one of <1> to <6>, which is used for forming a decorative pattern of a touch panel including the decorative pattern.

<8> A transfer film comprising: a temporary support; and a photosensitive resin layer including solid contents of the photosensitive resin composition according to any one of <1> to <7>.

<9> The transfer film according to <8>, further comprising: a thermoplastic resin layer between the temporary support and the photosensitive resin layer.

<10> The transfer film according to <9>, further comprising: a functional layer between the thermoplastic resin layer and the photosensitive resin layer.

<11> A decorative pattern which is a patterned cured material of the photosensitive resin composition according to any one of <1> to <7>, or a patterned cured material of the photosensitive resin layer of the transfer film according to any one of <8> to <10>.

<12> A touch panel comprising the decorative pattern according to <11>.

According to one embodiment of the invention, a photosensitive resin composition and a transfer film, in which occurrence of development residue in development using a weak alkali developer (for example, a sodium carbonate aqueous solution) is prevented and a tapered shape can be formed in heat treatment at a low temperature are provided.

According to another embodiment of the invention, a decorative pattern or a touch panel manufactured using the photosensitive resin composition and the transfer film is provided.

DESCRIPTION OF THE PREFERRED EMBODIMENTS

Figure 1:
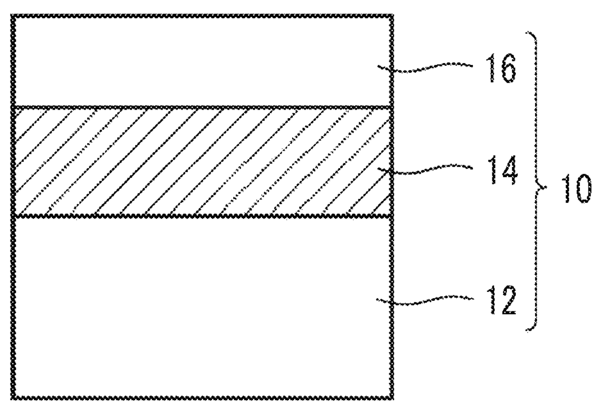
FIG. 1 is a schematic cross sectional view showing an example of a configuration of a transfer film of one embodiment of the invention.

Hereinafter, a photosensitive resin composition, a transfer film, a decorative pattern, and a touch panel of one embodiment of the invention will be described.

Constituent elements disclosed below are described with reference to representative embodiments and specific examples of the invention, but the invention is not limited to such embodiments and specific examples.

In this specification, a range of numerical values shown using "to" means a range including numerical values before and after "to" as a lower limit value and an upper limit value.

In the stepwise range of numerical values shown in this specification, an upper limit value or a lower limit value disclosed in a certain range of numerical values may be replaced with an upper limit value or a lower limit value of another stepwise range of numerical values. In addition, in the range of numerical values disclosed in this specification, an upper limit value or a lower limit value disclosed in a certain range of numerical values may be replaced with values shown in examples.

In this specification, a combination of preferred aspects is a more preferred aspect.

In this specification, in a case where a plurality of substances corresponding to components are present in the composition, the amount of each component in the composition means a total amount of the plurality of substances present in the composition, unless otherwise noted.

In this specification, a term "step" not only includes an independent step, but also includes a step, in a case where the step may not be distinguished from the other step, as long as the expected object of the step is achieved.

In this specification, "(meth)acrylic acid" has a concept including both acrylic acid and a methacrylic acid, "(meth) acrylate" has a concept including both acrylate and methacrylate, and "(meth)acryloyl group" has a concept including both acryloyl group and methacryloyl group.

In this specification, a "total amount of solid contents" means a total mass of components other than a solvent included in the composition.

In this specification, a "solid content of the photosensitive resin composition" means components other than the solvent in the photosensitive resin composition.

<Photosensitive Resin Composition>

The photosensitive resin composition includes a binder, a polymerizable monomer, a polymerization initiator, and a solvent, the polymerizable monomer at least includes a difunctional polymerizable monomer having a molecular weight equal to or smaller than 500, and a content of the difunctional polymerizable monomer having a molecular weight equal to or smaller than 500 is equal to or greater than 50% by mass with respect to a total mass of the polymerizable monomer.

The details of an operation mechanism of the photosensitive resin composition according to the embodiment of the invention are not clear and are assumed as follows.

A decorative layer used for a touch panel or the like is formed by using a transfer film including a photosensitive resin layer, and is, for example, formed through a step of transferring a photosensitive resin layer of a transfer film to a base material, a step of exposing the photosensitive resin layer with a desired pattern, a step of developing the photosensitive resin layer, and a step of performing heat treatment of the photosensitive resin layer to form a tapered shape. In this specification, a case simply describing a "tapered shape" means a forward tapered shape.

For a colored resin composition for a color filter disclosed in JP2013-228695A, only ethylenically unsaturated hexafunctional bond-containing compound is used. Accordingly, crosslink density of a cured material after the curing is high, and a tapered shape may not be formed in the heat treatment at a low temperature of approximately 140° C. in a case of forming a decorative layer on a resin base material, and thus, the decorative layer may not be used for a touch panel. This point also applies to the photosensitive compositions disclosed in JP2008-256729A and JP2012-078528A which are photosensitive compositions including a large amount of a polymerizable compound having three or more functional groups, in the same manner.

The colored resin composition for a color filter including an ethylenically unsaturated hexafunctional bond-containing compound disclosed in JP2013-228695A, or the photosensitive resin compositions including a large amount of polymerizable compound having three or more functional groups disclosed in JP2008-256729A and JP2012-078528A easily cause occurrence of development residue in development using the weak alkali developer, and thus, the photosensitive resin composition may not be used in the development using the weak alkali developer.

Since the photosensitive resin composition according to the embodiment of the invention includes a difunctional polymerizable monomer having a molecular weight equal to or smaller than 500, and a content of the difunctional polymerizable monomer is equal to or greater than 50% by mass with respect to a total mass of the polymerizable monomer, after the development step, a so-called heat sagging, which is deformation of a cured material having a reverse tapered shape to a tapered shape by the heat treatment at a low temperature, easily occurs. It is not preferable that the cured material after the development step has a reverse tapered shape, because fragments of a pattern edge are easily generated and linearity of the pattern is deteriorated, but the problems are solved by forming a tapered shape by the heat sagging.

In a case where a content of the polymerization initiator in the photosensitive resin composition is excessively great, the curing of the photosensitive resin composition excessively proceeds in the exposure step, and thus, the heat sagging due to the heat treatment at a low temperature hardly occurs. However, in a case where the photosensitive resin composition according to the embodiment of the invention includes the polymerization initiator, a desired pattern can be formed through the exposure step and the development step, the content of the polymerization initiator in the photosensitive resin composition does not excessively increase, and thus, the heat sagging easily occurs.

From this viewpoint, in the photosensitive resin composition according to the embodiment of the invention, the occurrence of development residue of the development using a weak alkali developer (for example, a sodium carbonate aqueous solution) is prevented, and a tapered shape can be formed in the heat treatment at a low temperature.

[Binder]

The photosensitive resin composition includes at least one kind of a binder.

The binder is a resin that at least a part thereof can be dissolved due to a contact with an alkali solvent.

Since the photosensitive resin composition includes the binder and the polymerization initiator which will be described later, the photosensitive resin composition can form a desired pattern by the exposure and the development.

As the binder, for example, the resin having a weight-average molecular weight can be used, among the resins disclosed in a paragraph [0025] of JP2011-095716A and paragraphs [0033] to [0052] of JP2010-237589A.

From a viewpoint of exhibiting more excellent pattern forming properties, the photosensitive resin composition preferably includes a binder including a carboxy group. By including the binder including a carboxyl group, the linearity of the formed pattern edge is further improved, and a so-called edge roughness tends to be improved.

The edge roughness means a value obtained by observing the pattern edge using a laser microscope (for example, VK-9500, Keyence Corporation, objective lens 50×), acquiring absolute values regarding five different portions, using a difference between the most swelled portion (peak) and the most narrow portion (bottom portion) of the pattern edge in a visual field as the absolute value, and calculating an average value of the five portions.

Specific examples of the binder include a random copolymer of benzyl (meth)acrylate/(meth)acrylic acid, a random copolymer of styrene/(meth)acrylic acid, a copolymer of cyclohexyl (meth)acrylate/(meth)acrylic acid/methyl (meth) acrylate, a glycidyl (meth)acrylate adduct of a copolymer of cyclohexyl (meth)acrylate/methyl (meth)acrylate/(meth) acrylic acid, a glycidyl (meth)acrylate adduct of a copolymer of benzyl (meth)acrylate/(meth)acrylic acid, a copolymer of allyl (meth)acrylate/(meth)acrylic acid, and a copolymer of benzyl (meth)acrylate/(meth)acrylic acid/hydroxyethyl (meth)acrylate.

Among these, from viewpoints of film forming properties and developability, the random copolymer of benzyl (meth) acrylate/(meth)acrylic acid is preferable.

As the binder, a commercially available product may be used, and examples thereof include ACRYLIC-BASED (registered trademark) FFS-6058 and FF187 manufactured by Fujikura Kasei Co., Ltd. and ACRIT (registered trademark) 8KB-001 manufactured by Taisei Fine Chemical Co., Ltd.

A weight-average molecular weight of the binder is preferably 4,000 to 25,000.

In a case where the weight-average molecular weight (Mw) of the binder is equal to or greater than 4,000, the linearity of the formed pattern is improved. In addition, tacking of the formed pattern is prevented, and accordingly, in a case where the transfer film includes a protective film, peeling properties of the protective film in a case of peeling the protective film are improved. On the other hand, in a case where the weight-average molecular weight of the binder is equal to or smaller than 25,000, the heat sagging properties are improved and the occurrence of the development residue is prevented.

From the same viewpoint, the weight-average molecular weight of the binder is preferably 4,000 to 20,000 and more preferably 5,000 to 15,000.

The measurement of the weight-average molecular weight of the binder can be performed by gel permeation chromatography (GPC) under the following conditions. A calibration curve is drawn from eight samples of "STANDARD SAMPLES TSK standard, polystyrene" manufactured by Tosoh Corporation: "F-40", "F-20", "F-4", "F-1", "A-5000", "A-2500", "A-1000", "n-propylbenzene".

<Conditions>

GPC: HLC (registered trademark)-8020 GPC (manufactured by Tosoh Corporation)

Column: TSKgel (registered trademark), three Super Multipore HZ-H (manufactured by Tosoh Corporation, 4.6 mmID×15 cm)

Eluent: Tetrahydrofuran (THF)
Sample Concentration: 0.45% by mass
Flow rate: 0.35 mL/min
Sample injected amount: 10 μL
Measurement temperature: 40° C.
Detector: differential refractometer (RI)

An acid value of the binder is preferably equal to or greater than 50 mgKOH/g, from viewpoints of further improving alkali solubility of an un-exposed portion at the time of the pattern formation and improving the linearity of the pattern. From the same viewpoints, the acid value of the binder is more preferably equal to or greater than 70 mgKOH/g, and more preferably equal to or greater than 100 mgKOH/g.

The acid value of the binder can be measured by the following method, for example.

(1) Propylene glycol monomethyl ether acetate is added to a resin solution (y (g)) having a concentration of solid contents (x (%)) for dilution, and a sample solution having a concentration of solid contents of 1% by mass to 10% by mass is produced.

(2) The titration is performed with respect to the sample solution with a potassium hydroxide•ethanol solution (tilter a) having a concentration of 0.1 mol/L using a potential difference measurement device (device name "HIRANUMA AUTOMATIC TITRATOR COM-550" manufactured by Hiranuma Sangyo Co., Ltd.), and the amount (b (mL)) of potassium hydroxide•ethanol solution necessary for the end of the titration is measured.

(3) The titration is performed with respect to water by the same method as in (2), and the amount (c (mL)) of potassium hydroxide•ethanol solution necessary for the end of the titration is measured.

(4) The solid content acid value of the resin is determined by the calculation performed using the following equation.

$$\text{Solid content acid value (mgKOH/g)}=\{5.611\times(b-c)\times a\}/\{(x/100)\times y\}$$

The content of the binder in the photosensitive resin composition is preferably 10% by mass to 70% by mass, more preferably 15% by mass to 60% by mass, and even more preferably 20% by mass to 50% by mass with respect to a total amount of solid contents of the composition.

The photosensitive resin composition may include the binder having a weight-average molecular weight exceeding the upper limit of the range of the weight-average molecular weight described above, within a range of exhibiting the effect. From viewpoints of the heat sagging and the development residue, the content of the binder having a weight-average molecular weight exceeding the upper limit of the range of the weight-average molecular weight described above is preferably equal to or smaller than 10% by mass, more preferably equal to or smaller than 5% by mass, even more preferably equal to or smaller than 1% by mass, and particularly preferably 0% by mass (not included), with respect to a total amount of solid contents of the composition.

In addition, the photosensitive resin composition may include the binder having a weight-average molecular weight smaller than the lower limit of the range of the weight-average molecular weight described above, within a range of exhibiting the effect. From viewpoints of the linearity of the formed pattern and the peeling properties of the protective film, the content of the binder having a weight-average molecular weight smaller than the lower limit of the range of the weight-average molecular weight described above is preferably equal to or smaller than 10% by mass, more preferably equal to or smaller than 5% by mass, even more preferably equal to or smaller than 1% by mass, and particularly preferably 0% by mass (not included), with respect to a total amount of solid contents of the composition.

[Polymerizable Monomer]

The photosensitive resin composition includes the polymerizable monomer, the polymerizable monomer includes a difunctional polymerizable monomer having a molecular weight equal to or smaller than 500, and the content of the difunctional polymerizable monomer having a molecular weight equal to or smaller than 500 is equal to or greater than 50% by mass with respect to a total mass of the polymerizable monomer. Hereinafter, a case simply describing the "polymerizable monomer" means a general term including the difunctional polymerizable monomer having a molecular weight equal to or smaller than 500 and other polymerizable monomers.

The difunctional polymerizable monomer can prevent the occurrence of the development residue even in the development with a weak alkali developer (for example, a sodium carbonate aqueous solution).

In addition, by using the polymerizable monomer having a molecular weight equal to or smaller than 500, the heat sagging of the heat treatment at a low temperature easily occurs.

With these viewpoints, since the content of the difunctional polymerizable monomer having a molecular weight equal to or smaller than 500 in the polymerizable monomer included in the photosensitive resin composition is equal to or greater than 50% by mass, the heat sagging easily occurs and the occurrence of the development residue of the development using the weak alkali developer is prevented.

From the above viewpoint, the content of the difunctional polymerizable monomer having a molecular weight equal to or smaller than 500 is preferably equal to or greater than 55% by mass and more preferably equal to or greater than 60% by mass with respect to a total mass of the polymerizable monomer. In addition, the content of the difunctional polymerizable monomer having a molecular weight equal to or smaller than 500 is preferably equal to or smaller than 100% by mass with respect to a total mass of the polymerizable monomer.

Further, since the photosensitive resin composition includes the polymerizable monomer, the linearity of the formed pattern is improved.

The polymerizable group included in the polymerizable monomer is not particularly limited.

Examples of the polymerizable group include an ethylenically unsaturated group and an epoxy group, the ethylenically unsaturated group is preferable, and the (meth) acryloyl group is more preferable.

The polymerizable monomer includes at least difunctional polymerizable monomer having a molecular weight equal to or smaller than 500 which is equal to or greater than 50% by mass with respect to a total mass of the polymerizable monomer, but the polymerizable monomer may include a polymerizable monomer other than the difunctional polymerizable monomer having a molecular weight equal to or smaller than 500.

In a case of using the difunctional polymerizable monomer having a molecular weight equal to or smaller than 500 and the other polymerizable monomer in combination, the difunctional polymerizable monomer having a molecular weight equal to or smaller than 500 and a trifunctional polymerizable monomer are preferably used in combination, from viewpoints of prevention of the residue of the carbonic acid development and film hardness.

The molecular weight of the polymerizable monomer other than the difunctional polymerizable monomer having a molecular weight equal to or smaller than 500 is preferably equal to or smaller than 3,000, more preferably equal to or smaller than 2,000, even more preferably equal to or smaller than 1,000, and particularly preferably equal to or smaller than 500.

In a case where the molecular weight of the polymerizable monomer is equal to or smaller than 500, the heat sagging of the heat treatment at a low temperature easily occurs.

The molecular weight of the polymerizable monomer can be obtained from a molecular formula by identifying a molecular structure by mass spectrography (for example, liquid chromatograph (LC/MS) analysis, gas chromatograph (GC/MS) analysis, or fast atom bombardment chromatograph (FAB/MS analysis)).

Examples of the polymerizable monomer include polyfunctional acrylate or polyfunctional methacrylate such as monofunctional acrylate or monofunctional methacrylate such as polyethylene glycol mono (meth)acrylate, polypropylene glycol mono (meth)acrylate, and phenoxyethyl (meth)acrylate; polyethylene glycol di (meth)acrylate, polypropylene glycol di (meth)acrylate, trimethylolethane triacrylate, trimethylolpropane triacrylate, trimethylolpropane diacrylate, neopentyl glycol di (meth)acrylate, pentaerythritol tetra (meth)acrylate, pentaerythritol tri (meth)acrylate, dipentaerythritol hexa (meth)acrylate, dipentaerythritol penta (meth)acrylate, hexanediol di (meth)acrylate, trimethylolpropane tri (acryloyloxypropyl) ether, tri (acryloyloxyethyl) isocyanurate, tri (acryloyloxyethyl) cyanurate, glycerin tri (meth)acrylate; a component obtained by (meth) acrylating after adding propylene oxide to ethylene oxide of polyfunctional alcohol such as trimethylolpropane or glycerin. In addition, a urethane type monomer such as a urethane (meth)acrylate compound can be also preferably used.

Examples thereof further includes polyfunctional acrylate or methacrylate such as urethane acrylates disclosed in JP1973-041708B (JP-S48-041708B), JP1975-006034B (JP-S50-006034B), and JP1976-037193A (JP-S51-037193A); polyester acrylates disclosed in JP1973-064183A (JP-S48-064183A), JP974-043191B (JP-S49-043191B), JP1977-030490B (JP-S52-030490B); and epoxy acrylates which are reaction products of an epoxy resin and (meth)acrylic acid.

Among these, dipentaerythritol hexa(meth)acrylate is preferable from a viewpoint of polymerization properties.

In addition, a urethane (meth)acrylate compound is preferable, from viewpoints of curing properties and bendability of the formed layer.

As the polymerizable monomer, a commercially available product may be used. Preferable examples of the commercially available product include tricyclodecanedimethanol diacrylate (A-DCP, Shin-Nakamura Chemical Co., Ltd., difunctional, molecular weight of 304), tricyclodecanedimenanol dimethacrylate (DCP, Shin-Nakamura Chemical Co., Ltd., difunctional, molecular weight of 332), 1,9-nonanediol diacrylate (A-NOD-N, Shin-Nakamura Chemical Co., Ltd., difunctional, molecular weight of 268), 1,6-hexanediol diacrylate (A-HD-N, Shin-Nakamura Chemical Co., Ltd., difunctional, molecular weight of 226), 9,9-bis [4-(2-acryloyloxyethoxy) phenyl] fluorene (A-BPEF, Shin-Nakamura Chemical Co., Ltd., difunctional, molecular weight of 546), urethane acrylate (UA-160TM™, Shin-Nakamura Chemical Co., Ltd., difunctional, molecular weight of 1,600), 1,6-hexanediol diacrylate (V #230, Osaka Organic Chemical Industry Ltd., difunctional, molecular weight of 226), 1,3-adamantyl diacrylate (ADDA, Mitsubishi Gas Chemical Company, Inc., difunctional, molecular weight of 276), trimethylolpropane triacrylate (A-TMPT, Shin-Nakamura Chemical Co., Ltd., trifunctional, molecular weight of 296), trimethylolpropane ethylene oxide (EO)-modified (n≈1) triacrylate (M-350, Toagosei Co., Ltd., trifunctional, molecular weight of 428), pentaerythritol tetraacrylate (A-TMMT, Shin-Nakamura Chemical Co., Ltd., tetrafunctional, molecular weight of 352), dipentaerythritol hexaacrylate (A-DPH, Shin-Nakamura Chemical Co., Ltd., hexafunctional, molecular weight of 578), pentaerythritol triacrylate hexamethylene diisocyanate urethane prepolymer (UA-306 H, Kyoeisha Chemical Co., Ltd., hexafunctional, molecular weight of 764), pentaerythritol triacrylate toluene diisocyanate urethane prepolymer (UA306T, Kyoeisha Chemical Co., Ltd., hexafunctional, molecular weight of 15,000), dipentaerythritol hexaacrylate (KAYARAD DPHA, Nippon Kayaku Co., Ltd., hexafunctional, molecular weight of 578), urethane (meth)acrylate (UA-32P, Shin-Nakamura Chemical Co., Ltd., nona-functional, molecular weight of 1,518), urethane (meth)acrylate (8UX-015A, Taisei Fine Chemical Co., Ltd., 15-functional, molecular weight of 2,077).

The content of the polymerizable monomer included in the photosensitive resin composition is preferably 5% by mass to 50% by mass, more preferably 10% by mass to 40% by mass, and even more preferably 10% by mass to 30% by mass with respect to a total amount of solid contents of the composition.

~Quantitative Relation of Binder and Polymerizable Monomer~

A ratio (M/B ratio) of a content mass (M) of the polymerizable monomer with respect to a content mass (B) of the binder in the photosensitive resin composition is preferably 0.10 to 0.50, more preferably 0.20 to 0.45, even more preferably 0.25 to 0.40, and particularly preferably 0.32 to 0.36.

In a case where the M/B ratio is equal to or greater than 0.10, the occurrence of the development residue is further prevented. On the other hand, the M/B ratio is equal to or smaller than 0.50, the linearity of the formed pattern is further improved.

[Polymerization Initiator]

The photosensitive resin composition includes at least one kind of the polymerization initiator.

The content of the polymerization initiator in the photosensitive resin composition is preferably greater than 0% by mass or equal to or smaller than 9% by mass with respect to a total amount of solid contents of the composition.

In a case where the content of the polymerization initiator in the photosensitive resin composition is greater than 0% by mass, a desired pattern can be formed by the exposure and the development. On the other hand, in a case where the content of the polymerization initiator is equal to or smaller than 9% by mass, the heat sagging of the heat treatment at a low temperature easily occurs, and the linearity of the formed pattern is improved.

From the same viewpoint, the lower limit of the content of the polymerization initiator in the photosensitive resin composition is preferably equal to or greater than 0.1% by mass, more preferably equal to or greater than 0.5% by mass, and even more preferably equal to or greater than 1% by mass with respect to a total amount of solid contents of the composition. On the other hand, the upper limit of the content of the polymerization initiator in the photosensitive resin composition is preferably equal to or smaller than 3.5% by mass and more preferably equal to or smaller than 3% by mass.

Examples of the polymerization initiator include a polymerization initiator disclosed in paragraphs [0031] to [0042] of JP2011-095716A and an oxime-based polymerization initiator disclosed in paragraphs [0064] to [0081] of JP2015-014783A.

As the polymerization initiator, a commercially available product can be used. Examples of the commercially available product preferably include 1,2-octanedione-1-[4-(phenylthio)-2-(O-benzoyloxime)] (product name: IRGACURE OXE-01, BASF Japan Ltd.), Ethan-1-one, [9-ethyl-6-(2-methylbenzoyl)-9H-carbazol-3-yl]-1-(0-acetyloxime) (product name: IRGACURE OXE-02, BASF Japan Ltd.), 2-(dimethylamino)-2-[(4-methylphenyl) methyl]-1-[4-(4-morpholinyl) phenyl]-1-butanone (product name: IRGACURE 379EG, BASF Japan Ltd.), 2-methyl-1-(4-methylthiophenyl)-2-morpholinopropan-1-one (product name: IRGACURE 907, BASF Japan Ltd.), 2-hydroxy-1-{4-[4-(2-hydroxy-2-methyl-propionyl)-benzyl] phenyl}-2-methyl-propan-1-one (product name: IRGACURE 127, BASF Japan Ltd.), 2-benzyl-2-dimethylamino-1-(4-morpholinophenyl)-butanone-1 (product name: IRGACURE 369, BASF Japan Ltd.), 2-hydroxy-2-methyl-1-phenyl-propan-1-one (product name: IRGACURE 1173, BASF Japan Ltd.), 1-hydroxy-cyclohexyl-phenyl-ketone (product name: IRGACURE 184, BASF Japan Ltd.), 2,2-dimethoxy-1,2-diphenylethan-1-one (product name: IRGACURE 651, BASF Japan Ltd.), and a product name of an oxime ester type polymerization initiator: Lunar 6 (DKSH Management Ltd.), 2,4-diethylthioxanthone (product name: KAYACURE DETX-S, Nippon Kayaku Co., Ltd.), and DFI-091 and DFI-020 which is a fluorene oxime type polymerization initiator (both, DAITO CHEMIX Co., Ltd.).

Among these, it is preferable to use an initiator other than a halogen-containing polymerization initiator such as a trichloromethyl triazine-based compound used for a color filter material, from a viewpoint of increasing sensitivity, it is more preferable to use a α-aminoalkylphenone compound, a α-hydroxyalkylphenone compound, or an oxime-based polymerization initiator such as an oxime ester compound, and it is particularly preferable to include the oxime-based polymerization initiator, from a viewpoint of further improving sensitivity in a case of the pattern formation.

The content of the polymerization initiator in the photosensitive resin composition is as described above.

A ratio (polymerization initiator/polymerizable monomer) of a content mass of the polymerization initiator with respect to a content mass of the polymerizable monomer in the photosensitive resin composition is preferably 0.05 to 0.60, more preferably 0.05 to 0.50, and even more preferably 0.07 to 0.30, from viewpoints of further preventing the development residue and effective preventing the precipitation of the polymerization initiator from the photosensitive resin layer.

[Polymerization Inhibitor]

The photosensitive resin composition preferably includes at least one kind of a polymerization inhibitor.

In a case where the photosensitive resin composition includes the polymerization inhibitor, the occurrence of the development residue is further prevented.

As the polymerization inhibitor, a thermal polymerization preventing agent (simply also referred to as a polymerization inhibitor) disclosed in a paragraph [0018] of JP4502784B can be used, for example. Among these, phenothiazine and phenoxazine can be suitably used.

A content of the polymerization inhibitor included in the photosensitive resin composition is preferably 0.01% by mass to 4% by mass, more preferably 0.1% by mass to 4% by mass, even more preferably 1% by mass to 4% by mass, and particularly preferably 3% by mass to 4% by mass with respect to a total solid content of the composition.

~Quantitative Relation of Polymerization Initiator and Polymerization Inhibitor~

A ratio (polymerization inhibitor/polymerization initiator) of a content mass of the polymerization inhibitor with respect to a content mass of the polymerization initiator in the photosensitive resin composition is preferably 0.01 to 0.5 and more preferably 0.05 to 0.3.

In a case where the polymerization inhibitor/polymerization initiator ratio is equal to or greater than 0.01, the occurrence of the development residue is further prevented. On the other hand, in a case where the polymerization inhibitor/polymerization initiator ratio is equal to or smaller than 0.5, the linearity of the formed pattern is further improved.

Regarding the content of the polymerization initiator in the photosensitive resin composition, the preferred range varies depending on the absence and presence of the polymerization inhibitor.

Regarding the combination of the content of the polymerization initiator and the content of the polymerization inhibitor in the photosensitive resin composition, in a case where the content of the polymerization initiator is 1% by mass to 9% by mass, the content of the polymerization inhibitor is preferably 0.1% by mass to 1% by mass, in a case where the content of the polymerization initiator is 2% by mass to 4% by mass, the content of the polymerization inhibitor is preferably 0.1% by mass to 1% by mass, and in a case where the content of the polymerization initiator is 2% by mass to 3% by mass, the content of the polymerization inhibitor is preferably 0.1% by mass to 0.5% by mass.

[Pigment]

The photosensitive resin composition includes at least one kind of a pigment.

The pigment is not particularly limited and can be suitably selected according to the purpose. Examples thereof include well-known organic pigment and inorganic pigment, and also include commercially available pigment dispersion or surface-treated pigment (for example, a component in which a pigment is dispersed in water, a liquid compound, or an insoluble resin as a dispersion medium, or a pigment having a surface treated with a resin or a pigment derivative).

Examples of the organic pigment and the inorganic pigment include a black pigment, a white pigment, a blue pigment, a cyan pigment, a green pigment, an orange pigment, a violet pigment, a brown pigment, a yellow pigment, a red pigment, and a magenta pigment.

Among these, from a viewpoint of light shielding properties, the black pigment, the white pigment, and the blue pigment are preferable, and the black pigment is more preferable.

(Black Pigment)

The black pigment is not particularly limited, as long as it can exhibit light shielding properties necessary for the photosensitive resin layer to be formed.

As the black pigment, a well-known black pigment, for example, a black pigment selected from the organic pigment and the inorganic pigment can be suitably used. The inorganic pigment includes a pigment including a metal compound such as a metal pigment or a metal oxide pigment.

From a viewpoint of improving optical density of the photosensitive resin layer to be formed, examples of the black pigment include carbon black, a titanium oxide pigment such as titanium carbon, iron oxide, or titanium black, and graphite, and among these, carbon black is preferable.

The carbon black is also available as a commercial product, and black pigment dispersion FDK-911 [product name: FDK-911] manufactured by Tokyo Printing Ink Mfg Co., Ltd. is used, for example.

From a viewpoint of further improving uniform dispersibility of the carbon black in the photosensitive resin layer, the carbon black is preferably carbon black having a surface coated with a resin (hereinafter, also referred to as a resin-coated carbon black). Regarding the coating of the carbon black with a resin, at least a part of the surface of the carbon black may be coated or the entire surface thereof may be coated.

The resin-coated carbon black can be produced by a method disclosed in paragraphs [0036] to [0042] of JP5320652B, for example. In addition, the resin-coated carbon black is also available as a commercial product, and SF Black GB 4051 manufactured by Sanyo Color Works, Ltd. is used.

A particle diameter of the black pigment is preferably 0.001 μm to 0.3 μm and more preferably 0.01 μm to 0.2 μm, in terms of a number average particle diameter, from a viewpoint of dispersion stability. The "particle diameter" here indicates a diameter in a case where an image of an electron micrograph of a particle is set as a circle having the same area. In addition, the "number average particle diameter" is an average value of the particle diameters, obtained by acquiring the particle diameters of 100 random particles.

The number average particle diameter of the black pigment included in the photosensitive resin composition can be calculated by measuring particle diameters of 100 random particles included in a viewing angle using an image obtained by imaging the photosensitive resin layer including the black pigment at 300,000 times by a transmission electron microscope (JEOL), and obtaining an average value of the measured values.

A content of the black pigment in the photosensitive resin composition is preferably 10% by mass to 70% by mass, more preferably 20% by mass to 60% by mass, and even more preferably 30% by mass to 55% by mass, with respect to a total amount of solid contents of the composition.

In a case where the content of the black pigment is equal to or greater than 10% by mass, the optical density of the photosensitive resin layer can be increased while maintaining a small film thickness. In a case where the content of the black pigment is equal to or smaller than 70% by mass, curing sensitivity in a case of patterning the photosensitive resin layer is improved.

The black pigment is desirable to be used in the photosensitive resin composition as a dispersion liquid. The dispersion liquid can be produced by adding and dispersing a composition obtained by mixing a black pigment and a pigment dispersing agent in advance to an organic solvent or a vehicle which will be described later. The vehicle is a portion of a medium which causes dispersion of the pigment in a case where the photosensitive resin composition is in a liquid state, and includes a liquid component which forms the photosensitive resin layer by combining with the black pigment (for example, a binder), and a medium such as an organic solvent which causes dissolving and diluting thereof.

The dispersing device used for dispersing the black pigment is not particularly limited, and examples thereof include well-known dispersing device such as a kneader, a roll mill, an attritor, a super mill, a dissolver, a homomixer, or a sand mill disclosed in Kunizo Asakura, "Pigment Encyclopedia", First Edition, Asakura Shoten, 2000, pp. 438. In addition, the black pigment which is a dispersoid may be finely pulverized using a friction force by a mechanical attrition disclosed in pp. 310 of the same document.

The pigment dispersing agent may be selected according to the pigment and the solvent included in the photosensitive resin composition, or a commercially available dispersing agent can be used, for example.

(Pigment Other than Black Pigment)

Examples of a pigment other than the black pigment include a pigment which is a pigment disclosed in paragraphs [0030] to [0044] of JP2008-224982A and shows a color tone other than black, and a pigment in which a chlorine (Cl) substituent is changed to a hydroxyl group (OH) such as C.I. Pigment Green 58, C.I. Pigment Blue 79.

Among these, C.I. Pigment Yellow 11, 24, 108, 109, 110, 138, 139, 150, 151, 154, 167, 180, 185, C.I. Pigment Orange 36, 38, 62, 64, C.I. Pigment Red 122, 150, 171, 175, 177, 209, 224, 242, 254, 255, C.I. Pigment Violet 19, 23, 29, 32, C.I. Pigment Blue 15:1, 15:3, 15:6, 16, 22, 60, 66, C.I. Pigment Green 7, 36, 37, and 58 are preferable.

However, the pigment which can be included in the photosensitive resin layer is not limited to the pigments described above.

[Solvent]

The photosensitive resin composition includes at least one kind of a solvent.

As the solvent, a solvent generally used can be used, without particular limitation. Specific examples of the solvent include ester, ether, ketone, and aromatic hydrocarbon.

In the same manner as Solvent disclosed in paragraphs [0054] and [0055] of US2005/282073A1, methyl ethyl ketone, propylene glycol monomethyl ether, propylene glycol monomethyl ether acetate (hereinafter, referred to as PEGMEA), cyclohexanone, cyclohexanol, methyl isobutyl ketone, ethyl lactate, and methyl lactate can be suitably used in the photosensitive resin composition.

Among the solvents described above, 1-methoxy-2-propyl acetate, methyl 3-ethoxypropionate, ethyl 3-ethoxypropionate, ethyl cellosolve acetate, ethyl lactate, butyl acetate, methyl 3-methoxypropionate, 2-heptanone, cyclohexanone, diethylene glycol monoethyl ether acetate (ethyl carbitol acetate), diethylene glycol monobutyl ether acetate (butyl carbitol acetate), propylene glycol methyl ether acetate, and methyl ethyl ketone are preferably used as the solvent.

In a case where the photosensitive resin composition includes the solvent, the solvent may be used alone or in combination of two or more kinds thereof.

As the solvent, an organic solvent having a boiling point of 180° C. to 250° C. (also referred to as high-boiling-point solvent) can be used, if necessary.

[Other Components]

The photosensitive resin composition may include a dye, a thiol compound, and the like, in addition to the components described above.

(Dye)

The photosensitive resin composition may include a dye, from a viewpoint of exhibiting antireflection ability. The dye which may be included in the photosensitive resin composition is not particularly limited. A well-known dye, for example, a well-known dye disclosed in a document such as "Handbook of Dyes" (edited by The Society of Synthetic Organic Chemistry, Japan., published in 1970), or a dye available as a commercial product can be suitably selected and used.

Specific examples of dye include dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium dyes, pyrylium salt, and a metal thiolate complex.

In a case where the photosensitive resin composition includes the dye, a content of the dye is preferably 1 parts by mass to 40 parts by mass and more preferably 1 parts by mass to 20 parts by mass with respect to 100 parts by mass of the pigment described above, from a viewpoint of exhibiting antireflection ability. In a case where the content of the dye is in the range described above, the antireflection effect of the photosensitive resin layer to be formed, that is, a visual glare prevention effect is improved.

(Thiol Compound)

It is preferable that the photosensitive resin composition includes the thiol compound, from a viewpoint of further increasing sensitivity in a case of the pattern formation.

A functional number of the thiol compound which is the number of thiol groups (also referred to as a mercapto group) may be monofunctional, or difunctional or higher.

In a case where the photosensitive resin composition includes the thiol compound, the thiol compound is preferably a di- or higher functional compound, more preferably di- to tetrafunctional compound, and particularly preferably a di- or trifunctional compound, from a viewpoint of further increasing the sensitivity.

As the monofunctional thiol compound which can be included in the photosensitive resin composition, N-phenylmercaptobenzimidazole is used.

Examples of the di- or higher functional thiol compound which can be included in the photosensitive resin composition include 1,4-bis (3-mercaptobutyryloxy) butane (KARENZ MT BD1, manufactured by SHOWA DENKO K.K.), 1,3,5-tris (3-mercaptobutyryloxyethyl)-1,3,5-triazine-2,4,6 (1H,3H,5H)-trione (KARENZ MT NR1, manufactured by SHOWA DENKO K.K.), pentaerythritol tetrakis (3-mercaptobutyrate) (KARENZ MT PE 1, manufactured by SHOWA DENKO K.K.), and pentaerythritol tetrakis (3-mercaptopropionate) ("PEMP" manufactured by Sakai Chemical Industry Co., Ltd.).

(Additive)

The photosensitive resin composition may include an additive. Examples of the additive include a surfactant disclosed in a paragraph [0017] of JP4502784B and paragraphs [0060] to [0071] of JP2009-237362A, and other additives disclosed in paragraphs [0058] to [0071] of JP2000-310706A.

As the surfactant, a fluorine-containing surfactant, for example, MEGAFACE (registered trademark) F-784-F and F-780F manufactured by DIC Corporation is preferably used, from a viewpoint of improving film properties in a case of coating and forming the photosensitive resin layer.

~Use of Photosensitive Resin Composition~

The photosensitive resin composition according to the embodiment of the invention can be used for forming a decorative pattern of a touch panel including a decorative pattern.

<Transfer Film>

A transfer film according to the embodiment of the invention includes a temporary support, and a photosensitive resin layer including solid contents of the photosensitive resin composition described above.

The photosensitive resin layer of the transfer film includes the solid contents of the photosensitive resin composition described above.

That is, in a case where the photosensitive resin composition includes the solvent, the photosensitive resin layer of the transfer film includes at least components (that is, solid contents) other than the solvent of the photosensitive resin composition. In this case, the photosensitive resin layer may further include a solvent. As the case where the photosensitive resin layer includes the solvent, for example, a case where the solvent remains in the photosensitive resin layer even after the drying, in a case of forming the photosensitive resin layer by applying and drying the photosensitive resin composition including the solvent is used.

The transfer film may include a layer other than the temporary support and the photosensitive resin layer, and preferably includes a protective peeling layer on a side opposite to the side of the photosensitive resin layer where the temporary support is disposed. In addition, the transfer film may include a layer other than the layer described above. Examples of the other layer include a thermoplastic resin layer and a functional layer.

The transfer film can be used for forming a decorative layer on at least one surface of an image display device such as a touch panel, and a tapered shape can be formed in heat treatment at a low temperature. The decorative layer formed by the transfer film has excellent linearity of a pattern.

Hereinafter, the configuration of the transfer film will be described.

~Configuration~

FIG. 1 is a schematic cross sectional view showing an example of the configuration of the transfer film of the embodiment of the invention.

A transfer film 10 shown in FIG. 1 includes a temporary support 12, a photosensitive resin layer 14, and a protective film (protective peeling layer) 16, in this order. FIG. 1 shows an aspect in which the temporary support 12, the photosensitive resin layer 14, and the protective film 16 are laminated to be adjacent to each other, but the configuration of the transfer film is not limited thereto, and, as will be described later, a thermoplastic resin layer (not shown) may be further provided between the temporary support 12 and the photosensitive resin layer 14, or a functional layer (not shown) can be further provided between the photosensitive resin layer 14 and the thermoplastic resin layer which is randomly provided.

The transfer film 10 according to the embodiment of the invention can be used, for example, as a transfer film for forming a decorative layer, that is, a patterned photosensitive resin cured layer on one surface of an image display device such as a touch panel.

A method of transferring the photosensitive resin layer 14 onto a base material and manufacturing a decorative pattern by using the transfer film 10 according to the embodiment of the invention will be described later.

[Photosensitive Resin Layer]

The transfer film includes a photosensitive resin layer including solid contents (that is, components other than solvent) of the photosensitive resin composition described above. In a case where the transfer film includes the photosensitive resin layer, the occurrence of development residue of the development using a weak alkali developer is prevented, and a tapered shape can be formed in the heat treatment at a low temperature.

The components included in the photosensitive resin composition and the preferred aspects thereof are as described above.

A film thickness of the photosensitive resin layer of the transfer film is preferably 0.5 μm to 10.0 μm, from a viewpoint of a design in a case of being used as a decorative pattern, more preferably 1.0 μm to 8.0 μm, and even more preferably 1.5 μm to 5.0 μm.

[Temporary Support]

The transfer film includes a temporary support.

The temporary support can be formed using a material having flexibility.

Examples of the temporary support which can be used in the transfer film include a cycloolefin copolymer film, a polyethylene terephthalate (PET) film, a cellulose triacetate film, a polystyrene film, and a polycarbonate film, and among these, a PET film is particularly preferable, from a viewpoint of handling.

The temporary support may be transparent or may be colored by including dyeing silicon, alumina sol, chromium salt, zirconium salt, or the like.

Conductivity can be applied to the temporary support by a method disclosed in JP2005-221726A, and the temporary support to which the conductivity is applied, is suitably used in the transfer film of the embodiment.

[Protective Film]

The Transfer film preferably further includes a protective film on a surface of the photosensitive resin layer, in order to protect the transfer film from contamination or scratches due to impurities such as dust during the storage. As the protective film, a film which can be easily peeled off from the photosensitive resin layer can be used, and the protective film can be suitably selected from films including the material same as or similar to that of the temporary support. As the protective film, a polyolefin film (for example, a polypropylene (PP) film or a polyethylene (PE) film), a polyethylene terephthalate (PET) film, a silicon paper, or a polytetrafluoroethylene film is suitable, for example.

In addition, a protective film disclosed in paragraphs [0083] to [0087] and [0093] of JP2006-259138A can be suitably used.

Since the transfer film includes the photosensitive resin layer including the photosensitive resin composition, tacking of the layer is prevented, and in a case where the transfer film includes the protective film, the peeling properties of the protective film are improved.

[Thermoplastic Resin Layer]

The transfer film may further include a thermoplastic resin layer between the temporary support and the photosensitive resin layer. As the thermoplastic resin layer, a thermoplastic resin layer disclosed in a paragraph [0026] of JP4502784B is used, for example.

As a component used in the thermoplastic resin layer, an organic polymer substance disclosed in JP1993-072724 (JP-H05-072724A) is preferable.

In a case where the transfer film includes the thermoplastic resin layer, cushioning properties can be applied to the transfer film, and even in a case where ruggedness is provided on a transferred surface, transfer properties can be increased.

A thickness of the thermoplastic resin layer after drying is normally 2 μm to 30 μm, preferably 5 μm to 20 μm, and particularly preferably 7 μm to 16 μm.

[Functional Layer]

The transfer film preferably includes a functional layer between the thermoplastic resin layer and the photosensitive resin layer. As the functional layer, an oxygen insulating film which has an oxygen insulating function disclosed in a paragraph [0027] of JP4502784B is used, for example.

As the oxygen insulating film, a film which shows low oxygen permeability and is dispersed or dissolved in water or an alkali aqueous solution is preferable, and the oxygen insulating film can be suitably selected among the well-known films. Among these, an oxygen insulating film including a combination of polyvinyl alcohol and polyvinyl pyrrolidone is preferable.

A thickness of the dried functional layer is normally 0.2 μm to 5 μm, preferably 0.5 μm to 3 μm, and more preferably 1 μm to 2.5 μm.

~Manufacturing Method of Transfer Film~

The transfer film can be manufactured based on a manufacturing method of a curable transfer material disclosed in paragraphs [0094] to [0098] of JP2006-259138A.

That is, the manufacturing method of the transfer film includes a step of forming a photosensitive resin layer on a temporary support. In addition, at least one of a step of forming a functional layer or a step of forming a thermoplastic resin layer may be included before forming the photosensitive resin layer on the temporary support.

In a case where the transfer film includes the thermoplastic resin layer, the manufacturing method of the transfer film preferably includes a step of forming a functional layer between the thermoplastic resin layer and the photosensitive resin layer, after the step of forming the thermoplastic resin layer.

In a case of forming the transfer film including the functional layer, the transfer film can be manufactured by applying a solution (coating solution for a thermoplastic resin layer) obtained by dissolving an thermoplastic organic polymer and an additive, used in combination if necessary, onto a temporary support, drying the solution to provide a thermoplastic resin layer, applying a coating solution for a functional layer produced by adding a resin and an additive to a solvent which does not dissolve the thermoplastic resin layer, onto the provided thermoplastic resin layer, drying the coating solution to laminate a functional layer, further applying a photosensitive resin composition produced using a solvent which does not dissolve the functional layer onto the laminated functional layer, and drying the photosensitive resin composition to form a photosensitive resin layer.

The components included in the photosensitive resin composition are as described above.

~Use of Transfer Film~

The transfer film according to the embodiment of the invention can be used for formation of a decorative pattern of a touch panel including a decorative pattern.

<Decorative Pattern>

The decorative pattern according to the embodiment of the invention is a patterned cured material manufactured using the photosensitive resin composition or the photosensitive resin layer of the transfer film.

More specifically, the decorative pattern is a patterned cured material formed by transferring the photosensitive resin layer of the transfer film according to the embodiment of the invention described above onto a base material, exposing and developing the photosensitive resin layer, and performing heat treatment at a low temperature.

The obtained patterned cured material, that is, the decorative pattern corresponds to a decorative layer of a touch panel which will be described later.

In addition, the decorative pattern manufactured using the transfer film according to the embodiment of the invention is preferably manufactured by the following manufacturing method of a decorative pattern.

<Manufacturing Method of Decorative Pattern>

The manufacturing method of a decorative pattern preferably includes a transfer step of transferring the photosensitive resin layer of the transfer film according to the embodiment of the invention described above onto a base material, a exposure and development step of exposing and developing the transferred photosensitive resin layer, and a heat treatment step of performing heat treatment at a low temperature equal to or lower than 200° C.

[Base Material]

As the base material, a material having no optical strain and having high transparency is preferably used.

From such a viewpoint, a glass base material or a resin base material having high transparency is preferable.

Among these, a resin base material is preferable, from viewpoints of lightness and resistance to breakage. Specific examples of the resin base material include base materials formed of resins such as polyethylene terephthalate (PET), polyethylene naphthalate, polycarbonate (PC), triacetyl cellulose (TAC), and cycloolefin polymer (COP).

From a viewpoint of further improving visibility of a display image, a refractive index of the base material is preferably 1.6 to 1.78 and a thickness thereof is preferably 50 μm to 200 μm.

The base material may have a single layer structure or a laminated structure including two or more layers. In a case where the base material has a laminated structure including two or more layers, the refractive index means a refractive index of all of the layers of the base material.

A material for forming the base material is not particularly limited, as long as such a range of the refractive index is satisfied.

In a case where the base material has a laminated structure including two or more layers, the thickness means a thickness of all of the layers of the base material.

In the transfer step, the photosensitive resin layer of the transfer film described above is transferred onto the base material.

In the exposure and development step, the photosensitive resin layer transferred onto the base material is pattern-exposed and an unexposed portion is developed.

As an example of the exposure, the development, and other steps of the photosensitive resin layer transferred onto the base material, a method disclosed in paragraphs [0035] to [0051] of JP2006-023696A can also be suitably used in the embodiment of the invention.

As the method of the exposure, specifically, a method of disposing a mask, on which a predetermined pattern is formed, above the photosensitive resin layer transferred onto the base material, that is, between the photosensitive resin layer and an exposure light source, and exposing the mask and the photosensitive resin layer from the above the mask through the temporary support.

The exposure light source can be suitably selected and used, as long as it can emit light having a wavelength region so as to cure the photosensitive resin layer (for example, 365 nm, or 405 nm). Specifically, an ultra-high pressure mercury lamp, a high pressure mercury lamp, a metal halide lamp, and the like are used. An exposure intensity is normally approximately 5 J/cm$^2$ to 200 mJ/cm$^2$, and is preferably approximately 10 J/cm$^2$ to 100 mJ/cm$^2$.

The pattern exposure may be performed after peeling the temporary support, or the exposure may be performed before peeling the temporary support and then, the temporary support may be peeled off. The pattern exposure may be exposure through a patterned mask or may be scanning exposure using a laser or the like (digital exposure).

The decorative pattern in which the decorative layer which is the patterned photosensitive resin layer is formed is manufactured on the base material through the steps described above.

Figure 2:
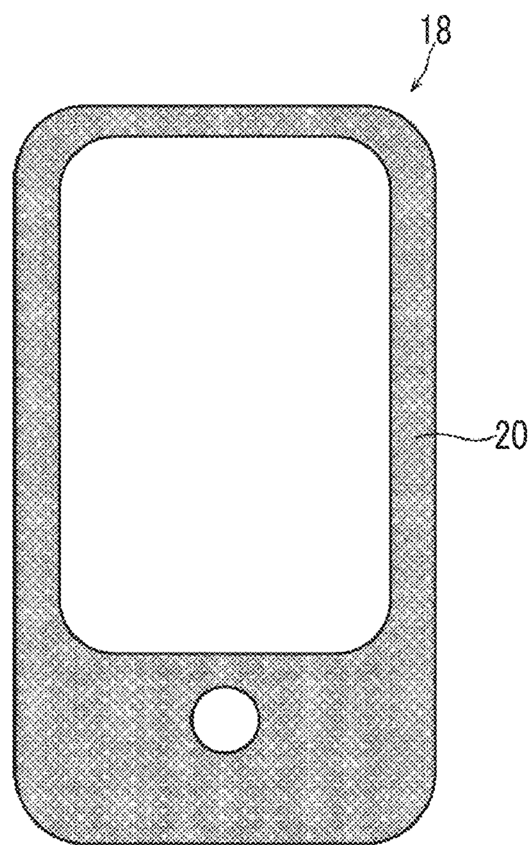
FIG. 2 is a schematic plan view showing an example of a touch panel including a decorative pattern.

FIG. 2 is a schematic plan view showing an example of a touch panel 18 including a decorative pattern 20 (decorative layer). In FIG. 2, a region displayed in black shows a formation region of the decorative layer 20. Since the touch panel 18 includes the decorative layer 20 having a shape shown in FIG. 2, wirings disposed on a main body of the touch panel 18 can be concealed.

The development in the manufacturing method of the decorative pattern is a development step, in a narrow sense, of developing and removing the unexposed portion of the pattern-exposed photosensitive resin layer with a developer and forming a patterned cured material.

The development can be performed using a developer. The developer is not particularly limited, and a well-known developer such as a developer disclosed in JP1993-072724 (JP-H05-072724A) can be used. As the developer, a developer which can dissolve the unexposed photosensitive resin layer is preferable, and for example, a developer including 0.05 mol/L to 5 mol/L of a compound having pKa of 7 to 13 (for example, sodium carbonate, potassium hydroxide, or the like) in terms of concentration is preferable. More specifically, a sodium carbonate aqueous solution, a potassium hydroxide aqueous solution, or the like is used. The sodium carbonate aqueous solution is preferable as the developer, from a viewpoint of productivity.

A small amount of an organic solvent having miscibility with water may be further added to the developer. Examples of the organic solvent having miscibility with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, Acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. A concentration of the organic solvent is preferably 0.1% by mass to 30% by mass.

A well-known surfactant can be further added to the developer. A concentration of the surfactant is preferably 0.01% by mass to 10% by mass.

As a method of the development, any method of paddle development, shower development, shower development and spin development, and dip development may be used. Here, in a case of the shower development, a patterned cured material can be formed by spraying the developer to the photosensitive resin layer after the exposure with a shower and removing the uncured material. After the development, the development residue is preferably removed while spraying a cleaning agent with a shower and rubbing with a brush or the like. A liquid temperature of the developer is preferably 20° C. to 40° C. and pH of the developer is preferably 8 to 13.

[Heat Treatment at Low Temperature]

In the manufacturing method of the decorative pattern, the heat treatment is preferably performed at a low temperature equal to or lower than 200° C., after developing the photosensitive resin layer. Through the heat treatment, the reverse tapered cured material, after the development, can be formed to have a tapered shape. In the embodiment of the invention, heat sagging can occur in a region at a low temperature equal to or lower than 200° C.

It is not preferable that the cured material after the development step has a reverse tapered shape, fragments of a pattern edge are easily generated and linearity of the pattern is deteriorated, but the problems are solved by forming a tapered shape by the heat sagging.

A temperature of the heat treatment is preferably equal to or lower than 200° C., more preferably 140° C. to 160° C., and even more preferably 140° C. to 150° C.

The time of the heat treatment is preferably 1 minute to 60 minutes, more preferably 10 minutes to 60 minutes, and even more preferably 20 minutes to 50 minutes.

By performing the heat treatment at such a temperature, in a case of forming the decorative pattern after forming other members such as an electrode pattern, a routing wiring, a light shielding conductive film, and an overcoat layer on the base material in advance, it is possible to prevent negative effect to the other members.

<Touch Panel>

The touch panel according to the embodiment of the invention includes the decorative pattern (decorative layer). The decorative pattern is preferably disposed on the outermost surface of the touch panel.

The touch panel including the decorative layer is not particularly limited and can be suitably selected according to the purpose. For example, a surface-type electrostatic capacitance type touch panel, a projection type electrostatic capacitance type touch panel, a resistive film type touch panel, or the like is used. The details thereof will be described later using a resistive film type touch panel and an electrostatic capacitance type touch panel.

The touch panel includes a so-called touch sensor and a touch pad. A layer configuration of a touch panel sensor electrode portion of the touch panel may have any of a bonding type of bonding two transparent electrodes, a type of including transparent electrodes on both surfaces of one substrate, a single surface jumper or a through-hole type, or a single surface lamination type. The operation type of the projection type electrostatic capacitance type touch panel is preferably alternating current (AC) driving rather than direct current (DC) driving, and more preferably a driving method having a short period of time for applying a voltage to an electrode.

[Resistive Film Type Touch Panel]

The resistive film type touch panel according to the embodiment of the invention is a resistive film type touch panel including the decorative pattern.

The resistive film type touch panel has a basic configuration in which conductive films on a pair of upper and lower substrates each including the conductive film are disposed at the opposing positions through a spacer. The configuration of the resistive film type touch panel is well known and a well-known technology can be applied without any limitation.

[Electrostatic Capacitance Type Touch Panel]

The electrostatic capacitance type touch panel according to the embodiment of the invention is an electrostatic capacitance type touch panel including the decorative pattern.

As the type of the electrostatic capacitance type touch panel, a surface type electrostatic capacitance type or a projection type electrostatic capacitance type is used. The projection type electrostatic capacitance type touch panel has a basic configuration in which an X axis electrode (hereinafter, also referred to as an X electrode) and a Y axis electrode (hereinafter, also referred to as a Y electrode) orthogonal to the X electrode are disposed through an insulator. Examples of the more specific aspect include an aspect in which the X electrode and the Y electrode are formed on separate surfaces on one substrate, an aspect in which the X electrode, an insulator layer, the Y electrode are formed on one substrate in this order, and an aspect in which the X electrode is formed on one substrate and the Y electrode is formed on the other substrate (in this aspect, the bonding configuration of the two substrates is the basic configuration described above). The configuration of the electrostatic capacitance type touch panel is well known and a well-known technology can be applied without any limitation in the embodiment.

EXAMPLES

Hereinafter, the invention will be described more specifically with reference to examples. The material, the amount used, the ratio, the process contents, the process procedure, and the like shown in the following examples can be suitably changed, within a range not departing from a gist of the invention. Accordingly, the range of the invention is not limited to specific examples shown below.

In addition, the unit "part" is based on mass, unless otherwise noted.

"—" in Table 1 means that the corresponding component is not included.

Example 1

Producing of Photosensitive Resin Composition

By stirring and mixing components in accordance with the list shown in Table 1, a photosensitive resin composition was produced. The details of the compound shown in Table 1 are as follows.

-Solvent-

1-Methoxy-2-propyl acetate: 238.7 parts

Methyl ethyl ketone: 321.3 parts

-Pigment Dispersion Liquid-

Black pigment dispersion liquid 2 shown below: 202.3 parts

-Binder-

Polymer 2: 145.6 parts 1-methoxy-2-propanol of benzyl methacrylate (a)/methacrylic acid (b) copolymer (composition (% by mass): a/b=70/30, weight-average molecular weight=5,000 and an acid value=112 mgKOH/g), methyl ethyl ketone solution (amount of solid contents: 45% by mass))

-Monomer-

A-DCP: 15.5 parts (manufactured by Shin-Nakamura Chemical Co., Ltd., molecular weight of 336, functional group number=2)

KAYARAD DPHA: 10.5 parts (Nippon Kayaku Co., Ltd., a propylene glycol monomethyl ether acetate (PGMEA) solution having 75% by mass of KAYARAD DPHA, molecular weight=578, functional group number=6)

-Polymerization Initiator-

Polymerization initiator 1: 4.0 parts (3.1% by mass with respect to a total amount of solid contents in the composition)

(1,2-octanedione-[4-(phenylthio)-2-(o-benzoyl oxime), BASF Japan Ltd., IRGACURE (registered trademark) OXE 01)

-Polymerization Inhibitor-

Polymerization inhibitor 2: 0.3 parts (Phenothiazine)

-Surfactant-

Surfactant 1: 0.4 parts (Following Structure 1)

-Producing of Black Pigment Dispersion Liquid 2-

Carbon black, a dispersing agent, a polymer, and a solvent were mixed with each other as the following composition, a dispersion process was performed using a triple roll mill and a beads mill, and the black pigment dispersion liquid 2 was obtained.

~Composition of Black Pigment Dispersion Liquid 2~

Resin-coated carbon black produced based on the description disclosed in paragraphs [0036] to [0042] of JP5320652B: 13.1% by mass Dispersing Agent 1: (following structure): 0.65% by mass Polymer: 6.72% by mass (Random copolymer having a molar ratio of benzyl methacrylate/methacrylic acid=72/28, weight-average molecular weight of 37,000)

Propylene glycol monomethyl ether acetate: 79.53% by mass

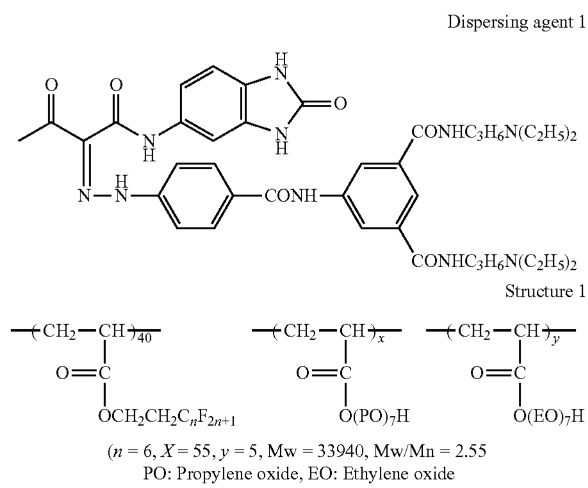

Example 2 to Example 10, Comparative Example 1 and Comparative Example 2

Each photosensitive resin composition of the examples and the comparative examples was produced in the same manner as in Example 1, except that the list of the photosensitive resin composition in Example 1 was changed as shown in Table 1.

<Preparation of Transfer Film>

A coating solution for a thermoplastic resin layer formed of the following list H1 was applied and dried on a polyethylene terephthalate film temporary support having a thickness of 75 μm using a slit-shaped nozzle to form a thermoplastic resin layer.

Next, a coating solution for a functional layer formed of the following list P1 was applied on the thermoplastic resin layer and dried to obtain a functional layer. In addition, the photosensitive resin composition was applied on the functional layer and dried to obtain a photosensitive resin layer.

By doing so, the thermoplastic resin layer having a film thickness after drying of 15.1 μm, the functional layer having a film thickness after drying of 1.6 μm, and a photosensitive resin layer having a film thickness after drying of 2.0 μm were provided on the temporary support, and finally, a protective film (polypropylene film having a thickness of 12 μm) was pressure-bonded to the surface of the photosensitive resin layer. By doing so, the transfer film including the temporary support 12, the photosensitive resin layer 14 including the thermoplastic resin layer, the functional layer (oxygen insulating film), and the photosensitive resin composition, and the protective film 16 was manufactured in the respective examples and comparative examples.

~Coating Solution for Thermoplastic Resin Layer: List H1~

Methanol: 11.1 parts

Propylene glycol monomethyl ether acetate: 6.36 parts

Methyl ethyl ketone: 52.4 parts

Copolymer of methyl methacrylate/2-ethylhexyl acrylate/benzyl methacrylate/methacrylic acid: 5.83 parts (Copolymerization composition ratio (molar ratio)=55/11.7/4.5/28.8, weight-average molecular weight=100,000, glass transition temperature (Tg)≈70° C.)

Copolymer of styrene/acrylic acid: 13.6 parts (Copolymerization composition ratio (molar ratio)=63/37, weight-average molecular weight=10,000, Tg≈100° C.)

2,2-bis [4-(methacryloxypolyethoxy) phenyl] propane: 9.1 parts (Shin-Nakamura Chemical Co., Ltd.)

Fluorine-based surfactant: 0.54 parts (Methyl ethyl ketone solution having the amount of solid contents of 30% by mass, DIC Corporation, MEGAFACE (registered trademark) F780F)

~Coating Solution for Functional Layer: List P1~

PVA205: 32.2 parts (polyvinyl alcohol, manufactured by Kuraray Co., Ltd., saponification degree=88%, polymerization degree of 550)

Polyvinyl pyrrolidone: 14.9 parts (ISP Japan, K-30)

Distilled water: 524 parts

Methanol: 429 parts

<Evaluation>

Various evaluations were performed regarding the transfer film manufactured using the photosensitive resin composition of the respective examples and comparative examples and the decorative pattern manufactured using the transfer film. The evaluation results are shown in Table 1.

~Manufacturing of Decorative Pattern~

The protective film of the transfer film corresponding to each of the examples and the comparative examples manufactured as described above was peeled off, and the photosensitive resin layer of the transfer film was overlapped so as to be in contact with the base material (colorless polyester film having a thickness of 200 μm), and a laminate including the photosensitive resin layer having a thickness of 2.0 μm was obtained.

A mask was placed on the temporary support which was disposed on a side opposite to the base material of the photosensitive resin layer overlapped on the base material, and the photosensitive resin layer was exposed from the above the mask using a metal halide lamp (dominant wavelength of 365 nm). After the exposure, the temporary support was peeled off, and the exposed photosensitive resin layer was dipped in a sodium carbonate aqueous solution having a concentration of 1% and developed.

After that, the heat treatment at a low temperature was performed by forming the heating at 145° C. for 30 minutes using an oven, and a frame-shaped decorative pattern (decorative layer) was obtained.

-Heat Sagging-

Figure 3:
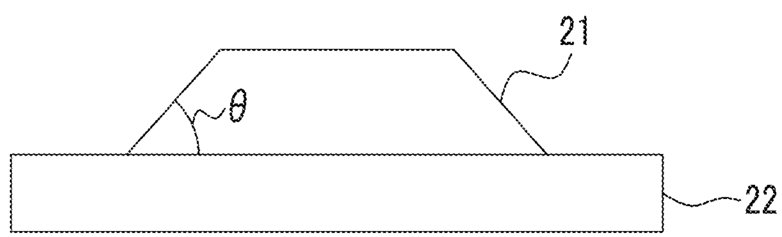
FIG. 3 is a diagram for describing an angle of a corner formed by a base material and an end portion of a decorative layer in evaluation of heat sagging of examples.

In each decorative pattern obtained as described above, an inner portion of the frame-shaped decorative layer was cut to manufacture a piece, the piece was observed with a scanning electron microscope (SEM, manufactured by Hitachi High-Technologies Corporation), an angle of a corner formed by the base material and the end portion of the decorative layer (θ in FIG. 3) was measured, and the evaluation was performed based on the following evaluation standard. The angle formed by the base material and the end portion of the decorative layer which is smaller than 90° C. indicates that the decorative layer has a forward tapered shape and means that the forward tapered shape is formed in the heat treatment at a low temperature. The angle formed by the base material and the end portion of the decorative layer which is greater than 90° C. indicates that the decorative layer has a reverse tapered shape. FIG. 3 is a diagram for describing the angle (θ) of a corner formed by a base material 22 and an end portion of a decorative layer 21. In the following evaluation standard, A and B are practical ranges.

<Evaluation Standard>

A: The angle formed by the base material and the end portion of the decorative layer is equal to or greater than 30° C. and smaller than 50° C.

B: The angle formed by the base material and the end portion of the decorative layer is equal to or greater than 50° C. and smaller than 90° C.

C: The angle formed by the base material and the end portion of the decorative layer is equal to or greater than 90° C.

-Development Residue-

The protective film of each transfer film obtained as described above was peeled off, the photosensitive resin layer of the transfer film was overlapped so as to be in contact with the base material (colorless polyester film having a thickness of 200 μm), and the photosensitive resin layer was overlapped from the transfer film. A mask (fine line pattern mask including lines and spaces) was placed on the temporary support which was disposed on a side opposite to the base material of the photosensitive resin layer overlapped on the base material, and the photosensitive resin layer was exposed from the above the mask using a metal halide lamp. After the exposure, the temporary support was peeled off, the development of the exposed photosensitive resin layer was performed with a sodium carbonate aqueous solution having a concentration of 1% at a liquid temperature of 30° C. by a shower developing device for 45 seconds, the absence and presence of the residue of the photosensitive resin layer in the outer portion (uncured portion) of the fine line pattern at that time was visually observed, and the evaluation was performed based on the following evaluation standard. In the following evaluation standard, A and B are practical ranges.

<Evaluation Standard>

A: Residue is not observed.

B: Area of the region, where the residue is observed, is smaller than 10% of the area of the unexposed portion of the substrate.

C: Area of the region, where the residue is observed, is equal to or greater than 10% of the area of the unexposed portion of the substrate.

-Linearity-

In each decorative pattern (decorative layer) obtained as described above, the inner portion of the frame-shaped decorative layer was observed with a laser microscope (VK-9500, Keyence Corporation, objective lens 50×), a difference between the most swelled portion (peak) and the most narrow portion (bottom portion) of the pattern edge in a visual field was obtained as an absolute value. The absolute value between the peak and the bottom portion was obtained in five portions, an average value of the five observed portion was calculated, and the calculated value was evaluated as edge roughness based on the following evaluation standard. The value of the edge roughness is preferably small, because an outline of the decorative pattern becomes sharp. In the following evaluation standard, A and B are practical ranges and A is preferable.

<Evaluation Standard>

A: Edge roughness is smaller than 2 μm.

B: Edge roughness is equal to or greater than 2 μm and smaller than 5 μm.

C: Edge roughness is equal to or greater than 5 μm.

TABLE 1

| | | Example 1 Composition-1 | Example 2 Composition-2 | Example 3 Composition-3 | Example 4 Composition-4 | Example 5 Composition-5 | Example 6 Composition-6 |
|---|---|---|---|---|---|---|---|
| Solvent (parts by mass) | 1-methoxy-2-propyl acetate | 238.7 | 238.7 | 321.5 | 265.5 | 245.5 | 194.8 |
| | methyl ethyl ketone | 321.3 | 321.3 | 228.5 | 384.2 | 315.5 | 377.8 |
| Pigment dispersion liquid (parts by mass) | Black pigment dispersion liquid 1 | — | 253.3 | — | 266.5 | — | 272.5 |
| | Black pigment dispersion liquid 2 | 202.3 | — | — | — | 252.1 | — |
| | Black pigment dispersion liquid 3 | — | — | 245.5 | — | — | — |
| Binder (parts by mass) | Polymer 1 Mw = 36,000 | — | — | — | — | — | — |
| | Polymer 2 Mw = 5,000 | 145.6 | 121.2 | — | — | 100.8 | 486.2 |
| | Polymer 3 Mw = 30,000 | — | 51.2 | 51.2 | — | 31.3 | — |
| | Polymer 4 Mw = 14,000 | — | — | 100.5 | 191.2 | — | — |
| Polymerizable monomer (parts by mass) | A-NOD-N Molecular weight = 268 Difunctional | — | 3.8 | — | 3.8 | 3.8 | 3.8 |
| | A-DCP Molecular weight = 336 Difunctional | 15.5 | 20.1 | — | 15.5 | — | 5.2 |
| | V# 230 | — | — | 18.5 | — | — | 15.5 |

TABLE 1-continued

| | | | | | | | |
|---|---|---|---|---|---|---|---|
| | Molecular weight = 226 Difunctional | | | | | | |
| | ADDA Molecular weight = 252 Difunctional | — | — | — | 5.5 | 23.5 | — |
| | A-BPEF Molecular weight = 546 Difunctional | — | — | 4.5 | — | — | — |
| | UA-160TM Molecular weight = 1012 Difunctional | — | — | — | — | — | — |
| | UA 306T Molecular weight = 15,000 Hexafunctional | — | — | — | — | — | — |
| | A-TMPT Molecular weight = 296 Trifunctional | — | — | — | — | — | — |
| | 8UX-015A Molecular weight = 2,077 15-functional | — | — | — | — | — | — |
| | M-350 Molecular weight = 428 trifunctional | — | — | — | — | — | — |
| | KAYARAD DPHA Molecular weight = 578 Hexafunctional | 10.5 | — | — | — | — | — |
| | A-TMMT Molecular weight = 352 Tetrafunctional | — | — | — | — | — | — |
| | UA-32P Molecular weight = 1,518 9-functional | — | — | — | — | — | — |
| Polymerization initiator (parts by mass) | Polymerization initiator 1 | 4.0 | — | — | — | — | — |
| | Polymerization initiator 2 | | 4.0 | 2.0 | 4.0 | 4.0 | — |
| | Polymerization initiator 3 | — | — | — | — | — | — |
| | Polymerization initiator 4 | — | — | — | — | — | 4.0 |
| | Polymerization initiator 5 | — | — | 2.0 | — | — | — |
| | Polymerization initiator 6 | — | — | — | — | — | — |
| Polymerization inhibitor (parts by mass) | Polymerization inhibitor 1 | — | 0.2 | — | 0.1 | 0.2 | 0.2 |
| | Polymerization inhibitor 2 | 0.3 | — | 0.1 | — | — | — |
| Surfactant (parts by mass) | Surfactant 1 | 0.4 | 0.4 | | 0.4 | 0.4 | 0.4 |
| | Surfactant 2 | — | — | 0.4 | — | — | — |
| Properties | M/B ratio | 0.36 | 0.37 | 0.47 | 0.33 | 0.53 | 0.11 |
| | Black pigment concentration (% by mass) | 20.6 | 34.8 | 40.8 | 33.8 | 25.9 | 19.8 |
| | Concentration of solid contents with respect to polymerization initiator (% by mass) | 3.1 | 2.2 | 2.7 | 2.0 | 3.1 | 1.2 |
| | Percentage of specific polymerizable monomer (% by mass) | 60 | 100 | 80 | 100 | 100 | 100 |
| | Concentration of solid contents (% by mass) | 13.7 | 17.9 | 15.4 | 17.3 | 13.1 | 25.2 |

TABLE 1-continued

| | | | | | | | |
|---|---|---|---|---|---|---|---|
| Evaluative results | Heat sagging | A | A | B | A | B | B |
| | Development residue | A | A | A | A | B | A |
| | linearity | A | A | A | A | B | A |

| | | Example 7 Composition-7 | Example 8 Composition-8 | Example 9 Composition-9 | Comparative Example 1 Composition-10 | Comparative Example 2 Composition-11 | Example 10 Composition-12 |
|---|---|---|---|---|---|---|---|
| Solvent (parts by mass) | 1-methoxy-2-propyl acetate | 238.7 | 210.5 | 222.5 | 212.5 | 225.3 | 222.5 |
| | methyl ethyl ketone | 298.5 | 318.5 | 352.2 | 285.5 | 325.4 | 352.2 |
| Pigment dispersion liquid (parts by mass) | Black pigment dispersion liquid 1 | 253.3 | — | 253.3 | — | — | 253.3 |
| | Black pigment dispersion liquid 2 | — | | — | — | — | — |
| | Black pigment dispersion liquid 3 | — | 252.5 | — | 251.2 | 251.2 | — |
| Binder (parts by mass) | Polymer 1 Mw = 36,000 | — | 79.3 | — | — | — | — |
| | Polymer 2 Mw = 5,000 | 292.3 | — | — | 100.5 | 100.5 | — |
| | Polymer 3 Mw = 30,000 | 475.3 | 31.8 | 292.5 | 151.3 | — | 292.5 |
| | Polymer 4 Mw = 14,000 | — | — | — | — | 198.5 | — |
| Polymerizable monomer (parts by mass) | A-NOD-N Molecular weight = 268 Difunctional | 3.8 | 3.8 | — | — | — | — |
| | A-DCP Molecular weight = 336 Difunctional | 15.3 | 17.5 | 15.2 | — | — | 15.2 |
| | V# 230 Molecular weight = 226 Difunctional | — | — | — | — | — | — |
| | ADDA Molecular weight = 252 Difunctional | — | — | — | — | — | — |
| | A-BPEF Molecular weight = 546 Difunctional | 1.5 | — | — | — | — | — |
| | UA-160TM Molecular weight = 1012 Difunctional | — | — | 3.5 | — | — | 3.5 |
| | UA 306T Molecular weight = 15,000 Hexafunctional | — | — | — | 15.1 | — | — |
| | A-TMPT Molecular weight = 296 Trifunctional | — | — | — | 5.2 | — | — |
| | 8UX-015A Molecular weight = 2,077 15-functional | — | — | 3.1 | — | — | 3.1 |
| | M-350 Molecular weight = 428 trifunctional | — | — | — | — | 5.6 | — |
| | KAYARAD DPHA Molecular weight = 578 Hexafunctional | — | — | — | 2.1 | 2.1 | — |
| | A-TMMT Molecular weight = 352 Tetrafunctional | — | — | — | — | 5.2 | — |
| | UA-32P Molecular weight = 1,518 9-functional | — | — | — | — | 2.5 | — |

TABLE 1-continued

| | | | | | | | |
|---|---|---|---|---|---|---|---|
| Polymerization initiator (parts by mass) | Polymerization initiator 1 | — | — | — | — | 4.0 | — |
| | Polymerization initiator 2 | 4.0 | 4.0 | 4.0 | 4.0 | — | 9.0 |
| | Polymerization initiator 3 | — | 1.0 | — | — | — | — |
| | Polymerization initiator 4 | — | — | — | — | — | — |
| | Polymerization initiator 5 | — | — | — | — | — | — |
| | Polymerization initiator 6 | — | — | 0.2 | — | — | — |
| Polymerization inhibitor (parts by mass) | Polymerization inhibitor 1 | 0.2 | — | 0.2 | 0.2 | 0.2 | 0.5 |
| | Polymerization inhibitor 2 | — | — | — | — | — | — |
| Surfactant (parts by mass) | Surfactant 1 | 0.4 | 0.4 | 0.4 | 0.4 | 0.4 | 0.4 |
| | Surfactant 2 | — | — | — | — | — | — |
| Properties | M/B ratio | 0.09 | 0.51 | 0.37 | 0.29 | 0.12 | 0.37 |
| | Black pigment concentration (% by mass) | 18.6 | 43.7 | 36.4 | 35.4 | 28.9 | 36.4 |
| | Concentration of solid contents with respect to polymerization initiator (% by mass) | 1.2 | 3.5 | 2.4 | 2.3 | 1.8 | 2.4 |
| | Percentage of specific polymerizable monomer (% by mass) | 93 | 100 | 70 | 0 | 0 | 70 |
| | Concentration of solid contents (% by mass) | 21.5 | 15.7 | 15.1 | 17.2 | 19.4 | 15.1 |
| Evaluative results | Heat sagging | B | B | B | C | C | B |
| | Development residue | B | B | A | C | C | A |
| | linearity | B | B | A | C | C | A |

* The specific polymerizable monomer means a difunctional polymerizable monomer having a molecular weight equal to or smaller than 500.

The details of each component shown in Table 1 are as follows.

-Pigment Dispersion Liquid-

Black pigment dispersion liquid 1: SF Black GB 4051 manufactured by Sanyo Color Works, Ltd. (resin-coated carbon black dispersion), concentration of solid contents of 35% by mass, pigment concentration of 25% by mass Black pigment dispersion liquid 2: Composition described above, concentration of solid contents of 17.47% by mass, pigment concentration of 13.1% by mass Black pigment dispersion liquid 3: Black pigment dispersion FDK-911 manufactured by Tokyo Printing Ink Mfg Co., Ltd. (concentration of solid contents of 30% by mass, pigment concentration of 25% by mass)

Binder

Polymer 1: 1-methoxy-2-propanol of (glycidyl methacrylate adduct (d) of a cyclohexyl methacrylate (a)/Methyl methacrylate (b)/methacrylic acid copolymer (c) (Composition (% by mass): a/b/c/d=46/1/10/43, weight-average molecular weight: 36,000, acid value of 66 mgKOH/g), methyl ethyl ketone solution (solid contents: 45%))

Polymer 2: 1-methoxy-2-propanol of benzyl methacrylate (a)/methacrylic acid (b) copolymer (Composition (% by mass): a/b=70/30, weight-average molecular weight: 5,000, acid value of 112 mgKOH/g), methyl ethyl ketone solution (solid contents: 45% by mass))

Polymer 3: 1-methoxy-2-propanol of acryl methacrylate (a)/methacrylic acid (b) copolymer (Composition (% by mass): a/b=80/20, weight-average molecular weight: 30,000, acid value of 66 mgKOH/g), methyl ethyl ketone solution (solid contents: 20% by mass))

Polymer 4: 1-methoxy-2-propanol of benzyl methacrylate (a)/methacrylic acid (b)/hydroxyethyl methacrylate (c) copolymer (composition (% by mass): a/b/c=60/21/19, weight-average molecular weight: 14,000, acid value of 33 mgKOH/g), methyl ethyl ketone solution (solid contents: 39% by mass))

-Polymerizable Monomer-

A-NOD-N: Shin-Nakamura Chemical Co., Ltd., molecular weight=268, functional group number=2

A-DCP: Shin-Nakamura Chemical Co., Ltd., molecular weight=336, functional group number=2

V #230: Osaka Organic Chemical Industry Ltd., molecular weight=226, functional group number=2

ADDA: Mitsubishi Gas Chemical Company, molecular weight=252, functional group number=2

A-BPEF: Shin-Nakamura Chemical Co., Ltd., molecular weight=546, functional group number=2

UA-160™: Shin-Nakamura Chemical Co., Ltd., molecular weight=1012, functional group number=2

UA306T: Kyoeisha Chemical Co., Ltd., molecular weight=15000, functional group number=6

A-TMPT: Shin-Nakamura Chemical Co., Ltd., molecular weight=296, functional group number=3

8UX-015A: Taisei Fine Chemical Co., Ltd., molecular weight=2077, functional group number=15

M-350: Toagosei Co., Ltd., molecular weight=428, functional group number=3

KAYARAD DPHA: Nippon Kayaku Co., Ltd., PGMEA solution having 75% by mass of KAYARAD DPHA, molecular weight=578, functional group number=6

A-TMMT: Shin-Nakamura Chemical Co., Ltd., molecular weight=352, functional group number=4

UA-32P: Shin-Nakamura Chemical Co., Ltd., molecular weight=1518, functional group number=9

-Polymerization Initiator-

Polymerization initiator 1: 1,2-octanedione-4-(phenylthio)-2-(o-benzoyloxime), BASF Japan Ltd., IRGACURE (registered trademark) OXE01

Polymerization initiator 2: Ethan-1-one, [9-ethyl-6-(2-methylbenzoyl)-9H-carbazol-3-yl]-1-(0-acetyloxime), BASF Japan Ltd., IRGACURE (registered trademark) OXE02

Polymerization initiator 3: DAITO CHEMIX Co., Ltd., DFI-020

Polymerization initiator 4: 2,4-bis (trichloromethyl)-6-[4'-(N,N-bis (ethoxycarbonyl methyl) amino-3'-bromophenyl]-s-triazine Polymerization initiator 5: 2-methyl-1-[4-(methylthio) phenyl]-2-morpholinopropan-1-one, BASF Japan Ltd., IRGACURE (registered trademark) 907

Polymerization initiator 6: 2,4-diethylthioxanthone, Nippon Kayaku Co., Ltd., KAYACURE DETX-S -Polymerization Inhibitor- Polymerization inhibitor 1: Benzotriazole Polymerization inhibitor 2: Phenothiazine -Surfactant- Surfactant 1: Structure 1 described above Surfactant 2: DIC Corporation, MEGAFACE (registered trademark) F-780F From the results shown in Table 1, the evaluation results of the heat sagging and the development residue of the transfer film formed of the photosensitive resin composition of the examples are excellent. From this, it is found that, in the transfer film formed of the photosensitive resin composition of the examples, the occurrence of development residue of the development using a weak alkali developer (sodium carbonate aqueous solution) is prevented, and a tapered shape can be formed in the heat treatment at a low temperature.

From Table 1, it is found that, in Comparative Example 1 and Comparative Example 2, the difunctional polymerizable monomer having a molecular weight equal to or smaller than 500 is not included, the molecular weight of the polymerizable monomer is high, and the functional group number is great, and thus, the evaluation results of the heat sagging and the development residue were deteriorated. From this, it is found that, in a case where the difunctional polymerizable monomer having a molecular weight equal to or smaller than 500 is not included, the development with a weak alkali developer (sodium carbonate aqueous solution) may not be performed, and a tapered shape may not be formed in the heat treatment at a low temperature.

The contents of Japanese Patent Application No. 2016-109184, filed May 31, 2016 are incorporated herein by reference.

All of the documents, the patent applications, and the technology standards described here are incorporated here by reference.

What is claimed is:

1. A decorative pattern which is a patterned cured material of the a photosensitive resin composition, the photosensitive resin composition comprising:

a binder;

a polymerizable monomer;

a polymerization initiator;

a pigment; and a solvent, wherein the polymerizable monomer includes a difunctional polymerizable monomer having a molecular weight equal to or smaller than 500, and a content of the difunctional polymerizable monomer having a molecular weight equal to or smaller than 500 is equal to or greater than 50% by mass with respect to a total mass of the polymerizable monomer, and wherein the polymerizable monomer comprises a urethane (meth)acrylate compound.

2. A touch panel comprising the decorative pattern according to claim 1.

3. The decorative pattern according to claim 1, wherein the pigment includes carbon black, and the pigment includes carbon black of 10% by mass to 36.4% by mass with respect to a total amount of solid contents of the composition.

4. The decorative pattern according to claim 1, wherein the binder is at least one selected from the group consisting of a random copolymer of benzyl (meth) acrylate/(meth)acrylic acid, a random copolymer of styrene/(meth)acrylic acid, a copolymer of cyclohexyl (meth)acrylate/(meth)acrylic acid/methyl (meth)acrylate, a glycidyl (meth)acrylate adduct of a copolymer of cyclohexyl (meth)acrylate/methyl (meth)acrylate/(meth)acrylic acid, a glycidyl (meth)acrylate adduct of a copolymer of benzyl (meth)acrylate/(meth)acrylic acid, a copolymer of allyl (meth)acrylate/(meth)acrylic acid, and a copolymer of benzyl (meth)acrylate/(meth) acrylic acid/hydroxyethyl (meth)acrylate, and wherein the polymerizable monomer has an ethylenically unsaturated group which is a polymerizable group.

5. The decorative pattern according to claim 1, wherein the polymerization initiator includes at least one selected from an α-aminoalkylphenone compound, an α-hydroxyalkylphenone compound, or an oxime ester compound.

6. A decorative pattern which is a patterned cured material of a photosensitive resin composition, the photosensitive resin composition comprising:

a binder;

a polymerizable monomer;

a polymerization initiator;

a pigment; and a solvent, wherein the polymerizable monomer includes a difunctional polymerizable monomer having a molecular weight equal to or smaller than 500, and a content of the difunctional polymerizable monomer having a molecular weight equal to or smaller than 500 is equal to or greater than 50% by mass with respect to a total mass of the polymerizable monomer, and wherein the pigment includes carbon black at an amount of 10% by mass to 36.4% by mass with respect to a total amount of solid contents of the composition.

7. The decorative pattern according to claim 6, wherein the pigment includes carbon black at an amount of 20% by mass to 36.4% by mass with respect to a total amount of solid contents of the composition.

8. The decorative pattern according to claim 6, wherein the binder is at least one selected from the group consisting of a random copolymer of benzyl (meth) acrylate/(meth)acrylic acid, a random copolymer of styrene/(meth)acrylic acid, a copolymer of cyclohexyl (meth)acrylate/(meth)acrylic acid/methyl (meth)acrylate, a glycidyl (meth)acrylate adduct of a copolymer of cyclohexyl (meth)acrylate/methyl (meth)acrylate/(meth)acrylic acid, a glycidyl (meth)acrylate adduct of a copolymer of benzyl (meth)acrylate/(meth)acrylic acid, a copolymer of allyl (meth)acrylate/(meth)acrylic acid, and a copolymer of benzyl (meth)acrylate/(meth) acrylic acid/hydroxyethyl (meth)acrylate, and wherein the polymerizable monomer has an ethylenically unsaturated group which is a polymerizable group.

9. The decorative pattern according to claim 6, wherein the polymerization initiator includes at least one selected from an α-aminoalkylphenone compound, an α-hydroxyalkylphenone compound, or an oxime ester compound.

* * * * *